United States Patent [19]

Hillenius et al.

[11] Patent Number: 4,825,278
[45] Date of Patent: Apr. 25, 1989

[54] RADIATION HARDENED SEMICONDUCTOR DEVICES

[75] Inventors: Steven J. Hillenius; William T. Lynch, both of Summit; Lalita Manchanda, North Plainfield, all of N.J.

[73] Assignee: American Telephone and Telegraph Company AT&T Bell Laboratories, Murray Hill, N.J.

[21] Appl. No.: 20,771

[22] Filed: Mar. 2, 1987

Related U.S. Application Data

[63] Continuation-in-part of Ser. No. 788,415, Oct. 17, 1985.

[51] Int. Cl.[4] .................................... H01L 29/40
[52] U.S. Cl. .................................. 357/53; 357/54; 357/23.11
[58] Field of Search ................... 357/53, 42, 54, 23.11

[56] References Cited

U.S. PATENT DOCUMENTS

| | | | |
|---|---|---|---|
| 3,602,782 | 8/1971 | Klein | 357/53 |
| 3,841,926 | 10/1974 | Garnache | 357/53 |
| 4,333,225 | 10/1982 | Yeh | 357/53 |
| 4,661,202 | 4/1987 | Ochii | 357/42 |

OTHER PUBLICATIONS

IBM Technical Disclosure Bulletin, vol. 16, #3, pp. 702–703, by Shepard, Aug. 1973.
IEEE Transactions on Electron Devices vol. 19, #11 pp. 1199–1206, Nov. 1972, by Lin.
IBM Technical Disclosure Bulletin, vol. 57, No. 10A, pp. 5701–5702, Mar. 1985.

Primary Examiner—Andrew J. James
Assistant Examiner—Mark Prenty
Attorney, Agent, or Firm—Lester H. Birnbaum

[57] ABSTRACT

Disclosed are semiconductor devices and circuits which are highly resistant to the effects of radiation. A thin conductive layer, which is biased at substrate potential, and a thin oxide are provided under the usual field oxide of the devices. The conductive layer shields the semiconductor substrate from the effects of charge generation in the field oxide due to radiation absorption.

15 Claims, 12 Drawing Sheets

RADIATION HARDENED SEMICONDUCTOR DEVICES

CROSS REFERENCE TO RELATED APPLICATIONS

This is a continuation-in-part application of U.S. patent application Ser. No. 788,415, filed Oct. 17, 1985, assigned to Bell Telephone Laboratories and AT&T, now abandoned.

BACKGROUND OF THE INVENTION

This invention relates to semiconductor devices and integrated circuits, and in particular to providing devices and circuits which can withstand radiation.

Semiconductor devices and integrated circuits generally provide fast and reliable operation in a wide variety of applications. However, if charge is generated in the oxide over the semiconductor, then charges may collect at the underlying semiconductor surface causing inversion and threshold reduction. Since charge generation in the oxide produces a threshold change which, to a first order, is proportional to the square of the oxide thickness, the portion of the device below the field oxide is especially susceptible to this problem.

Charge generation in the oxide can occur due to radiation of various types. For example, gamma radiation from outer space operation or from nuclear explosions can cause this effect. Further, certain processes used in the fabrication of the devices, such as reactive ion etching, can produce radiation which causes charge generation in the oxide.

It is, therefore, an object of the invention to provide a semiconductor device structure which is not susceptible to the adverse effects of radiation charge buildup. It is a further object of the invention to provide such a structure with a minimum of additional processing steps over standard processing techniques.

SUMMARY OF THE INVENTION

These and other objects are achieved in accordance with the invention which is a semiconductor device comprising a semiconductor substrate including active and inactive portions with a thick insulator overlying the inactive portions. The device further includes a conductive layer placed between the inactive portion of the semiconductor substrate and the thick insulator and covering essentially the entire area of the inactive portion of the semiconductor. The conductive layer is electrically coupled to the underlying semiconductor substrate.

BRIEF DESCRIPTION OF THE DRAWING

These and other features are delineated in detail in the following description and in the drawing wherein.

Figure 1:
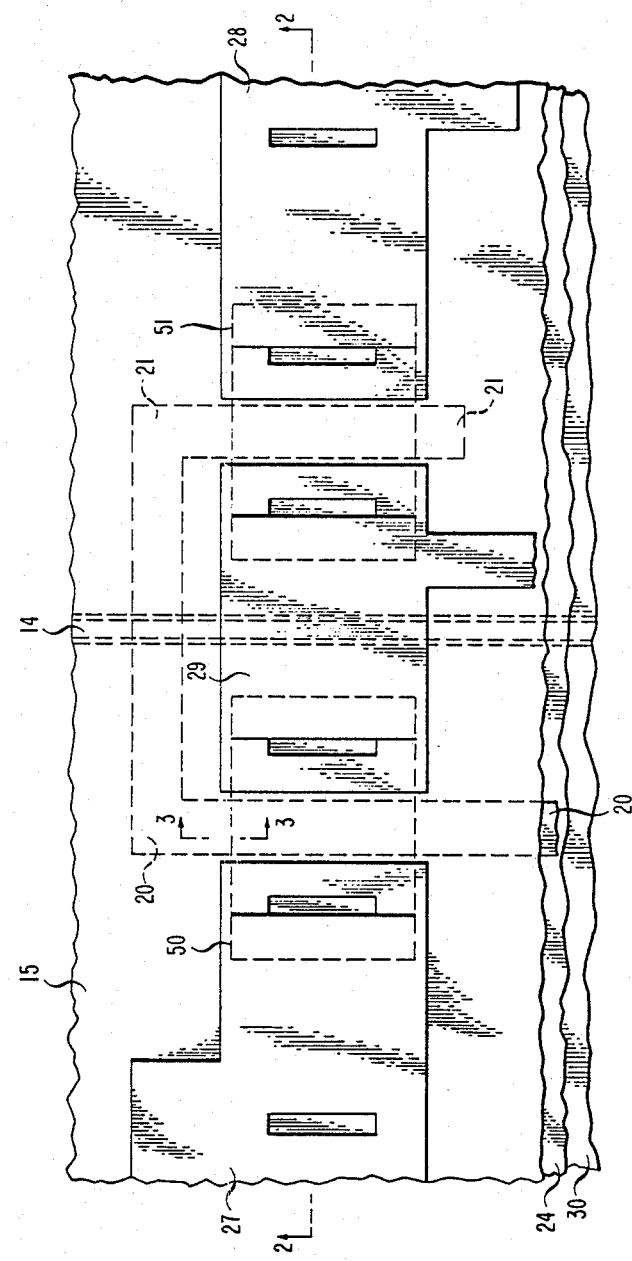
FIG. 1 is a plan view of a portion of a typical MOS circuit utilizing the invention in accordance with one embodiment.

It will be appreciated that for purposes of illustration these Figures are not necessarily drawn to scale.

DETAILED DESCRIPTION OF THE DRAWING

Figure 2:
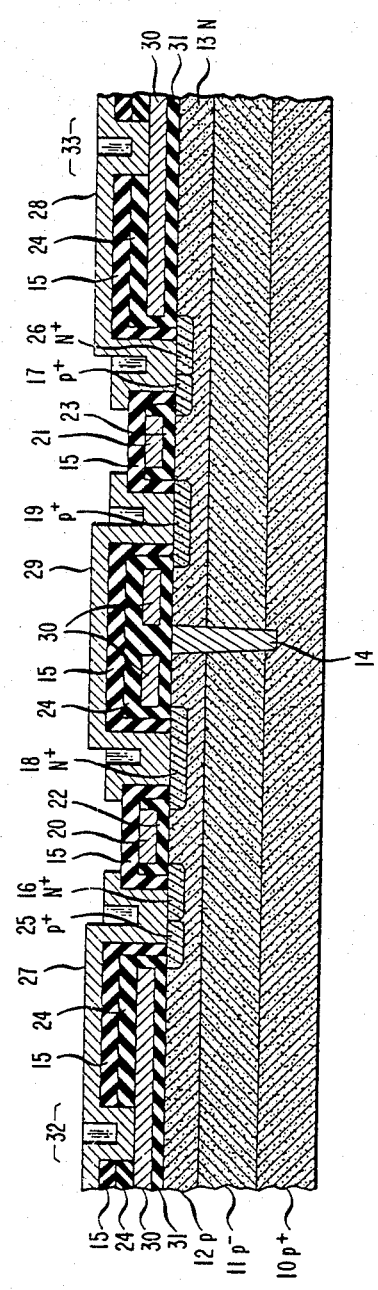
FIG. 2 is a cross-sectional view taken along line 2—2 of FIG. 1.

FIGS. 1 and 2 are plan and cross-sectional views of a portion of a typical CMOS circuit including the invention in accordance with one embodiment. It will be appreciated that the circuit is merely illustrative and the invention can be used with any MOS circuit. The circuit portion is a typical inverter element formed by complementary MOS device technology. The circuit is formed in a silicon substrate, 10, which is typically doped with boron to a concentration of $10^{19} cm^{-3}$ so as to exhibit a p+conductivity type. A surface region, 11, which extends along the entire area of the substrate is doped with boron to a concentration of $10^{15} cm^{-3}$ to exhibit a p−conductivity type. The N-channel devices are formed with p-type tubs such as 12 which in the example are doped with boron to a concentration of $2 \times 10^{16} cm^{-3}$, while the p-channel devices are formed in n-type tubs such as 13 which in this example are doped with phosphorus to a concentration of $2 \times 10^{16} cm^{-3}$. The tubs are isolated from each other by trenches, such as 14, etched through the surface region 11. These trenches are discussed in more detail later.

The surface area of the substrate can be considered to be divided into active and inactive portions. The active portions include the source and drain regions of the devices (16, 17 and 18, 19, respectively) and, except for areas of electrical contact to the surface, are covered by a thin oxide 22, 23 (commonly called the gate oxide) which in this example was 250 Angstroms thick, but is typically within the range 150–500 Angstroms thick. The gate electrodes, 20 and 21, are formed over this thin oxide in the region between the sources and drains to define the conductive channels. Included adjacent to each source region in the active portion are localized regions 25 and 26 of p+and n+conductivity, respectively, which permit electrical contact of the sources at the potential of their respective tub regions as required for inverter circuits. These localized regions may be omitted from other types of MOS devices.

Thus, the active portions can be considered to be the areas covered by the thin oxide and including the source, drain and other localized surface areas (which, due to lateral diffusion, will extend slightly below the thicker oxide regions discussed later).

The portions of the substrate which do not include the source, drain, channel and localized contact regions are designated inactive portions, and they are covered by a much thicker oxide, 24 (commonly called the field oxide) which in this example was 4,000 Angstroms thick, but is usually within the range 2,500–10,000 Angstroms thick. This field oxide prevents metal contact layers to the source and drain (27, 28 and 29, respectively), as well as the portion of the gate electrode outside the active region, from having any significant influence on the underlying semiconductor in the inactive portions. In general, it is desirable that the field oxide thickness be at least ten times the gate oxide thickness in order to reduce interconnect capacitance.

As mentioned previously, charge generated in the field oxide, 24, can, without the additional features of the invention, cause inducement of charge in the underlying semiconductor surface which adversely affects device operation. In accordance with a main feature of the invention a conductive layer, 30, is placed between the field oxide and the semiconductor surface in essentially the entire inactive portion of the semiconductor except for narrow areas over trenches (14) where it is desired to electrically isolate the portions of the conductor layer over the n and p tubs. For CMOS circuits where trenches are not used, an electrical isolation of the conductive layer 30 over the n and p tubs is still desirable. For NMOS, PMOS or bipolar circuits with uniform substrates, the conductive layer 30 is continuous throughout the inactive portions. (The dashed rectangles 50 and 51 in FIG. 1 illustrate the boundaries between active and inactive portions and therefore show the boundaries of layer 30, which will be in all areas outside the rectangles except over trench 14.) In this example, the conductive layer was polycrystalline silicon doped with As to a concentration of $5\times10^{19}$cm$^{-3}$ to provide sufficient conductivity, but any conductive layer would appear suitable. For example, the conductive layer 30 over the n tub, regions 13, may be doped with As, and the conductor layer 30 over the p tub, regions 12, may be doped with boron. This combination is a desirable choice to increase the magnitudes of the threshold voltages needed to invert the tub surfaces, as is discussed later. The thickness of the layer was approximately 1,500 Angstroms, but thicknesses in the range 250–5,000 Angstroms would be useful. It is also desirable to include beneath the conductive layer a thin oxide layer, 31, which can be the same material and approximately the same thickness as the gate oxide 22 and 23, so that inversion problems from charge generation can be reduced. The doping of the conductive layer need not be the same conductivity type as the underlying semiconductor.

The conductive layer 30 is electrically connected to the same potential as the underlying tub region in order that no charge is induced on the underlying semiconductor by the presence of a bias on the conductive layer itself. This also reduces the need for a high "chanstop" doping at the surface of the inactive portions and thereby reduces edge capacitance between the source and drain regions and the inactive regions. The use of a bias on the conductive layer 30 that is identical to the potential of the underlying tub is not essential but the use of identical potentials will not result in any yield loss due to occasional shorts through the thin oxide layer 31. Any such shorts, unless they couple directly to the drain nodes, are inconsequential to the operation of the devices. The connection between layer 30 and the semiconductor is achieved in this example by forming windows 32 and 33 in the field oxide over the conductive layer and depositing source contact layers 27 and 28 thereover which are electrically connected to both the source and tub regions. In cases where the source regions are not electrically tied to the tub regions, separate contacts can be formed from the conductive layer 30 to the respective underlying tub. The windows 32 and 33 may be as shown or may overlap with the windows to the underlying tubs so that a portion of the conductive layer is exposed to electrical contact in the same window as the surface regions (e.g., 25 and 16). Only one window (32 or 33) is required for each conductive layer 30 over a tub, although more may be introduced to reduce ac coupling effects from signal leads to the substrate tub via any resistively decoupled regions of layer 30.

The conductive layer 30 will shield the underlying semiconductor surface from the effects of any charges accumulated in the field oxide over the conductive layer since any electric field lines established by the charges will terminate at the conductive surface. Any charge which has accumulated in the thinner oxide, 31, under the conductive layer or in the gate oxide, 22 or 23, will have little effect on the semiconductor surface due to the thinness of these oxides.

One of the advantages of providing the conductive layer 30 for protection against radiation-induced charges is that it can be incorporated into standard MOS processing with no additional masking, very little extra processing, and without significantly increasing the area of the device.

An example of a typical process incorporating the shield is given with regard to the sequence of steps illustrated in FIGS. 3–13. Elements corresponding to those of FIGS. 1 and 2 are similarly numbered.

Figure 3:
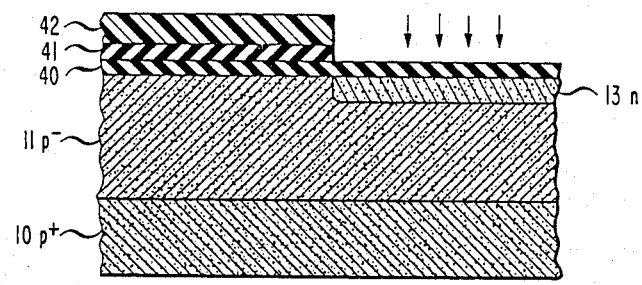
FIGS. 3–13 are cross-sectional views of the device of FIG. 2 in various stages of fabrication.
Figure 4:
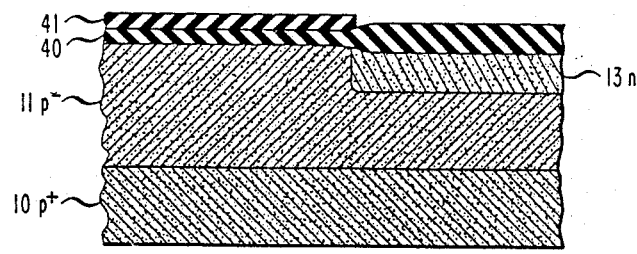
Figure 5:
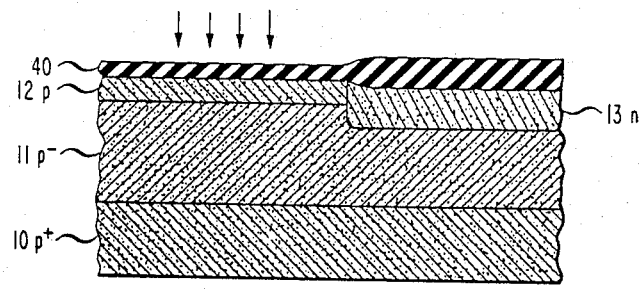

FIG. 3 illustrates the p+substrate, 10, with the surface layer, 11, of p-conductivity type which has previously been formed by epitaxy. Formed over the entire surface of the semiconductor is a layer, 40, of SiO$_2$ which is typically 300 Angdtroms $\mu$m thick. A silicon nitride layer, 41, which is approximately 1,200 Angstroms thick is formed over the entire surface of the oxide, but is then etched off of the areas where n-tubs are to be produced by standard photolithography employing a photoresist 42. As illustrated, the n-tubs, such as 13, are formed by ion implantation of an appropriate impurity such as phosphorus. The resist is then stripped off and the n-tub impurities are driven further into the semiconductor by heating in a wet oxygen ambient, typically at a temperature of 950 degrees C for approximately 200 min. This results in the configuration of FIG. 4 with a thicker portion of oxide 40 formed over the n-tub. As illustrated in FIG. 5, the nitride layer, 41, is etched off and the p-type tubs such as 12 are formed by ion implantation of an impurity such as boron. The thicker portion of oxide 40 shields the n-tub from these impurities.

At this point, one may drive in the implanted p-type impurities as in the case of the n-type impurities. However, in devices such as these using trench isolation, it is believed desirable to postpone drive-in until after the trenches are cut.

Figure 6:
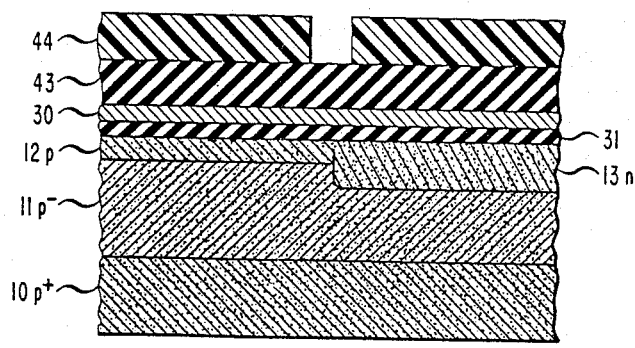

Therefore, following implantation of the p-tub, the oxide, 40, is removed and a new SiO$_2$ layer, 31, is formed on the semiconductor surface as shown in FIG. 6. This layer, which will remain under the conductive shield in the final device, is typically approximately 250 Angstroms thick. Next, a layer 30, of polycrystalline silicon, which will form the conductive shield, is deposited by chemical vapor deposition to a thickness of approximately 2,000 Angstroms. The layer is then made conductive by doping with a suitable impurity such as Arsenic, typically with a concentration of $5\times10^{19}$cm$^{-3}$. A thick layer of SiO$_2$, 43, is then deposited over the polycrystalline layer, 30, by chemical vapor deposition to a thickness of approximately 10,000 Angstroms. A photoresist layer, 44, is deposited and patterned to expose the areas where it is desired to etch the isolation trenches.

Figure 7:
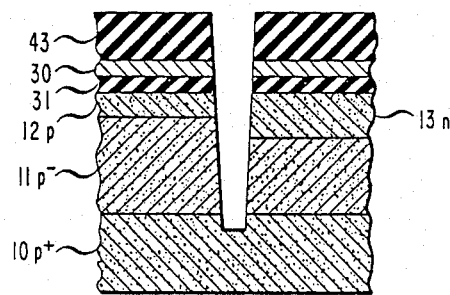

Next, as shown in FIG. 7, the trenches, such as 14, are etched in the areas exposed by the photoresist using layer 43 as a mask. This is done by standard techniques, such as applying hydrocarbon and chlorine reactive ion etching gases to etch through the oxide, 43, polycrystalline silicon layer, 30, oxide layer, 31, and the semiconductor into the p+substrate, 10. The trench will electrically isolate the p-tub and n-tub. It will be appreciated that the same mask used to define the trenches also separates the portions of the conductive shield over the n and p-tubs. Hence, no additional masking is required. If trench isolation is not employed, there would be no need to have a layer 43 and only the polycrystalline layer, 30, would be etched at this point. The oxide, 43, is then stripped off by, for example, applying a hydrocarbon reactive ion etchant. The sidewalls of the trenches can then be cleaned by standard techniques.

Figure 8:
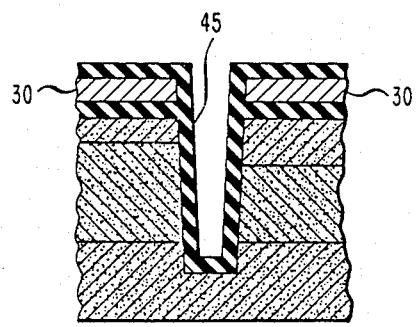

Next, as illustrated in FIG. 8, a layer, 45 of $SiO_2$ is formed over the sidewalls of the trenches and over the polycrystalline silicon layer 30. This is accomplished, for example, by heating in dry oxygen at 1,000 degrees C for 180 min. which produces an oxide layer with a thickness of approximately 1,000 Angstroms.

Figure 9:
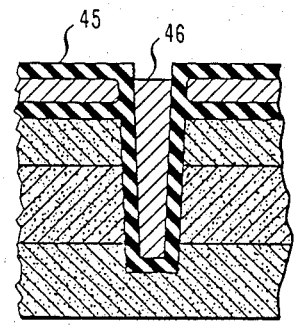

As illustrated in FIG. 9, the trenches are filled with polycrystalline material 46. This can be done, for example, by depositing a thick layer of polycrystalline silicon (approximately 2 $\mu$m) over the entire structure and then etching back the top portion of the layer until only the polycrystalline silicon in the trenches remains. The oxide layer, 45 over the polycrystalline layer, 30, protects the latter from being etched. The n and p-tubs may be driven in to their final depths between the steps of deposition and etching back of the polycrystalline silicon.

Figure 10:
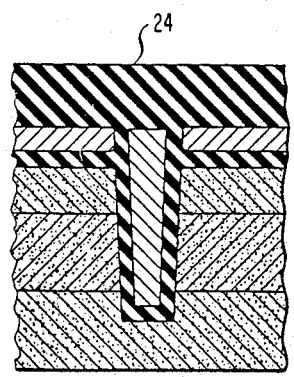
Figure 11:
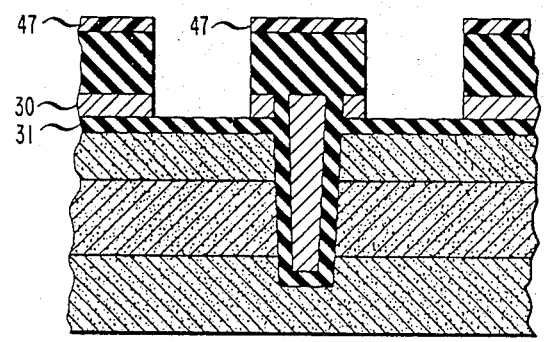

The portion of the oxide layer 45, over the shield layer 30 can then be removed, for example, by hydrocarbon reactive ion etching. As shown in FIG. 10, the field oxide layer, 24, is then formed, typically, by depositing a material such as $SiO_2$ by chemical vapor deposition to a thickness of approximately 4,000 Angstroms and densifying the oxide by annealing at 900 degrees C. The field oxide is then patterned to expose the areas of the semiconductor which will comprise the active regions of the circuit. This is done as shown in FIG. 11 by using a photoresist layer 47 as an etch mask. First, the field oxide is etched, for example, by a hydrocarbon reactive ion etching. The polycrystalline shield layer 30 should act as an effective etch stop for this operation. Then, the exposed portions of the polycrystalline layer can be etched, for example, by applying chlorine reactive ion etching to give the structure of FIG. 11. The thin oxide, 31, underlying the shield layer acts as a natural etch stop for this etching step. The photoresist layer (47) is then stripped off.

Figure 12:
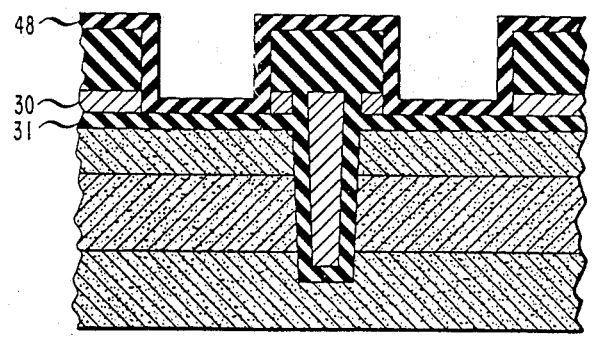

It is then desirable to form an oxide on the sidewalls of the openings in the field oxide and on the sidewalls of the shield layer to avoid the possibility of shorts between the shield layer and the subsequently formed gate metal. This could be accomplished by growing a thermal oxide on the walls of the shield layer. However, in this example the oxide is formed by chemical vapor deposition (CVD). Consequently, as shown in FIG. 12, a thin (approximately 1,000 Angstroms) oxide layer, 48, is deposited over the entire structure, including the sidewalls of the field oxide and shield layer, by standard CVD methods, and then densified. (The boundary between the CVD oxide and the previously formed oxides is shown for the sake of illustration only in this figure and is removed in subsequent figures.)

Figure 13:
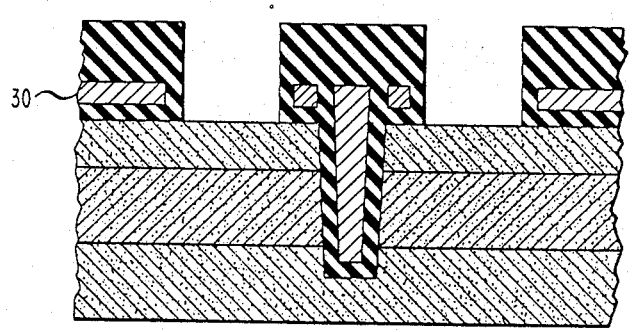

As illustrated in FIG. 13, the portion of the CVD oxide, 48, and the underlying oxide 31 at the bottom of the etched areas of the field oxide can then be removed, for example, by an anisotropic, controlled, low power reactive ion etching. This will expose areas of the semiconductor which will be the active portions and leave the conductive shield layer, 30, embedded within the previously formed oxides over the inactive portions of the semiconductor. The exposed silicon surface can then be cleaned, a gate oxide formed and then standard procedures used to fabricate the active portions of the circuit along with the appropriate contact layers to form devices such as illustrated in FIG. 2. Standard processing includes formation of gate electrodes and a phosphorus-doped glass layer, 15, over the field oxide as shown in FIGS. 1 and 2. The only variation in normal processing is that additional windows 32 and 33 are etched in the field oxide 24 and glass layer 15 prior to contact formations so that the shield layer can be electrically contacted to the tubs through the source contacts 27 and 28 (see FIG. 2). These windows can be formed by standard photolithographic techniques at the same time as the source, drain and gate contact windows.

Figure 14:
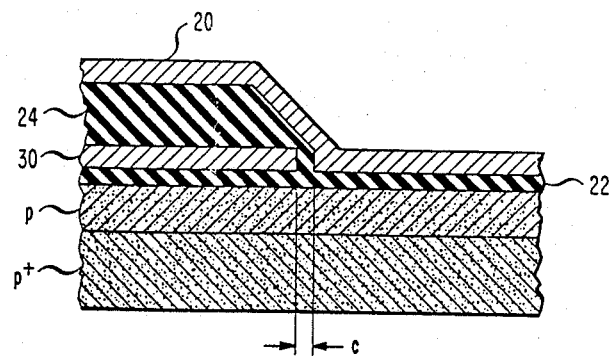
FIG. 14 is a cross-sectional view along line 3—3 of FIG. 1 illustrating a further advantage of the invention.

In addition to providing shielding action against radiation-induced charge generation, the shield layer 30 can provide additional advantages in circuit fabrication. For example, FIG. 14 illustrates, in a cross-sectional view along line 3—3' of FIG. 2, a portion of a CMOS device where the gate metal, 20, makes the transition from overlying gate oxide, 22, (active region) to overlying the field oxide 24 (inactive region). (The P-glass layer, 15, is omitted for the sake of illustration.) Normally, without a shield, there must be an essentially vertical step from the field oxide to the gate oxide to minimize any parasitic action of the gate metal on the areas outside the active region. Due to the presence of the shield layer, 30, the region of parasitic capacitance is limited to the region marked "C" in the figure, which is the lateral spacing between the shield, 30, and the edge of the gate metal, 20, over the thin oxide region. This narrow region results because any electric field from the portion of the gate metal above the shield will terminate at the shield and not influence the underlying semiconductor. The presence of the shield, therefore, permits the field oxide-to-gate oxide transition to be sloped as shown for better gate metal coverage without the penalty of an increased parasitic channel. This sloped oxide can be formed in the above-described example by using an isotropic etch to pattern partially or all the way through the field oxide layer, 24, (FIG. 11) followed by an anisotropic etching of any remaining oxide and the exposed polycrystalline silicon, 30.

Figure 15:
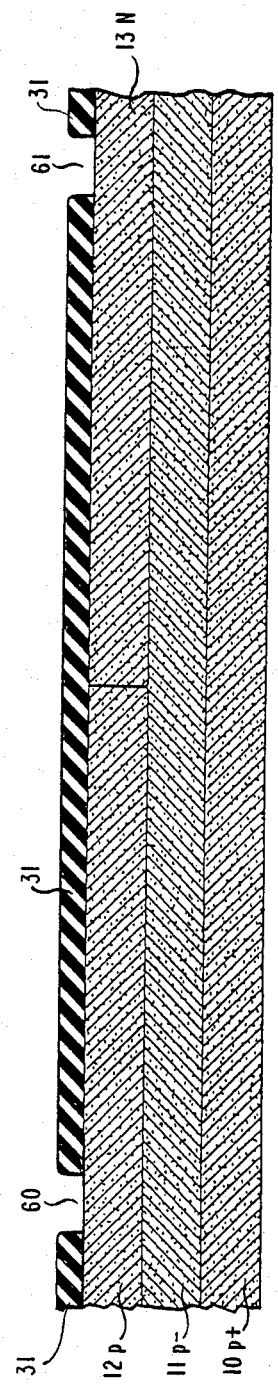
FIGS. 15–21 are cross-sectional views of a device during various stages of fabrication in accordance with a further embodiment.

A further embodiment of the invention is illustrated in the sequence of steps shown in FIGS. 15–21, where elements corresponding to those of the previous figures are similarly numbered. FIG. 15 illustrates the stage where the p and n tubs, 12 and 13 respectively, have already been formed and driven into in the semiconductor layer 11.

Figure 16:
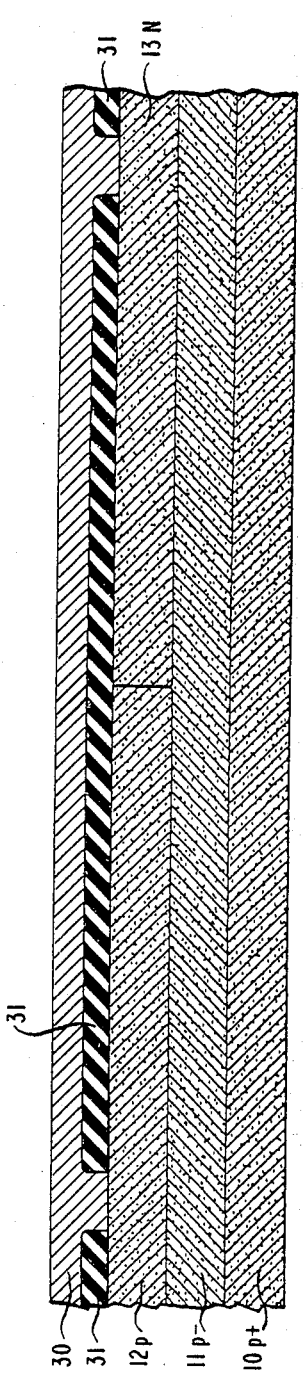
Figure 17:
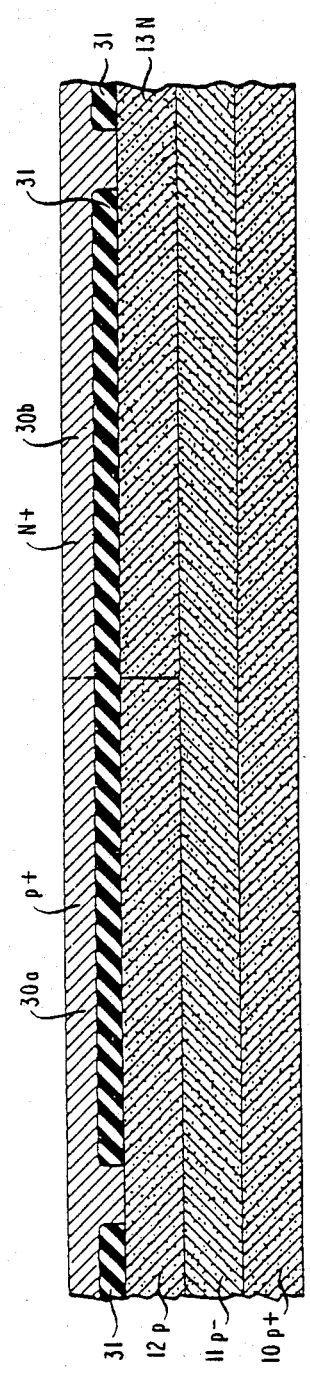

An $SiO_2$ layer, 31, is then deposited over essentially the entire semiconductor surface as before. In this embodiment, however, multiple openings 60 and 61 are formed in the oxide layer, 31, over the areas of the p and n tubs, respectively. The openings can be formed by means of standard photolithographic techniques using a photoresist (not shown). Next, as illustrated in FIG. 16, a polycrystalline silicon layer, 30, is deposited over the oxide layer and over the openings therein. As deposited, the layer is preferably undoped. As illustrated in FIG. 17, however, the layer 30 is subsequently doped so that the portion, 30a, over the p-tub is made p-type, such as by implantation of boron impurities therein, and the portion, 30b, over the n-type tub is made n-type, such as by implantation of phosphorous or arsenic therein. The impurity concentration of the portions, 30a and 30b, would be typically approximately $10^{19} cm^{-3}$. Selective doping of these portions of the polycrystalline layer, 30, can be accomplished by using two different photoresist layers, or a combination of silicon nitride and photoresist layers as known in the art, or by any other suitable technique.

Figure 18:
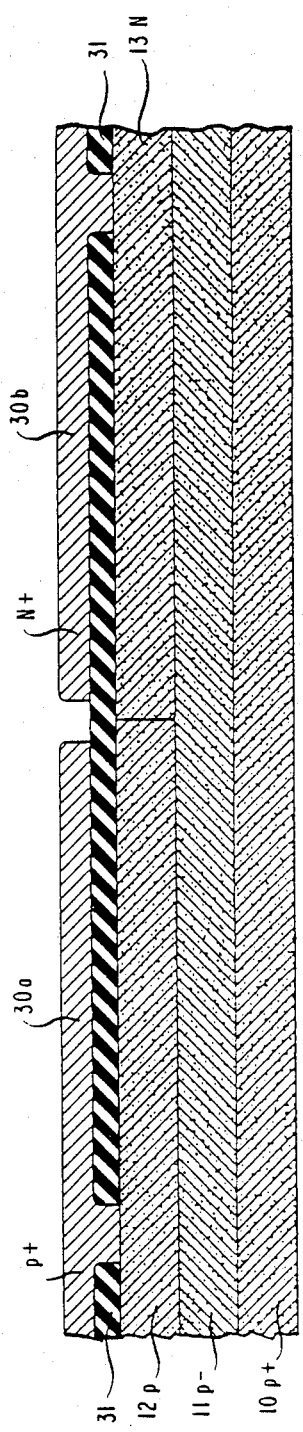

Next, as illustrated in FIG. 18, the portions, 30a and 30b, of the polycrystalline silicon layer 30 over the p and n tubs are isolated by etching through the layer over the boundary between the tubs. The same technique described previously can be used here to separate the two portions as well as form a trench in the semiconductor. In this particular example, no trench is formed, and so only the polycrystalline layer 30 is etched, typically using a reactive ion etch with chlorine.

Figure 19:
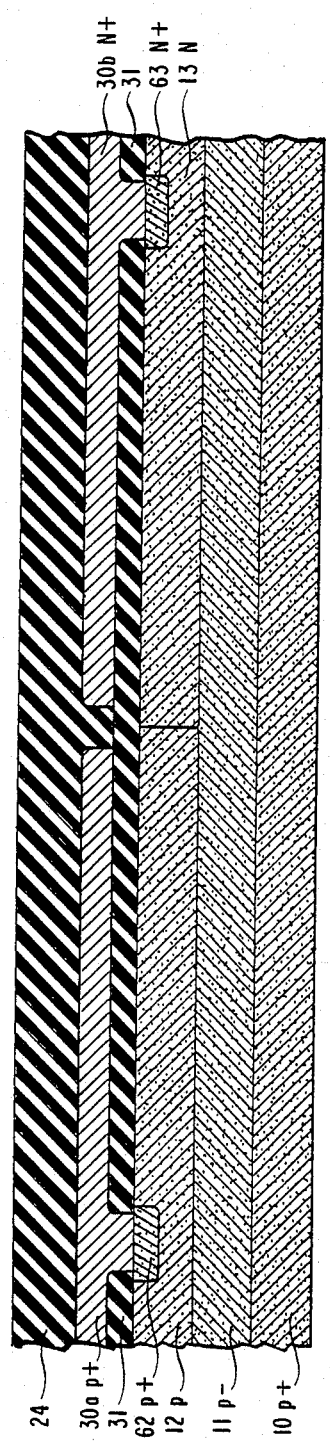

The field oxide layer, 24, can be deposited over the structure as before, as illustrated in FIG. 19. During the annealing step, some dopant impurities will diffuse from the p-type and n-type portions 30a and 30b through the openings in the underlying oxide 31 and into the surface of the semiconductor to produce localized surface regions, 62 and 63, of p+ conductivity type in the p-tub and n+ conductivity in the n-tub. These regions typically have concentrations of $\sim 10^{19} cm^{-3}$ in order to form low resistance contact regions between the field shield layer portions and their respective semiconductor tub regions.

Figure 20:
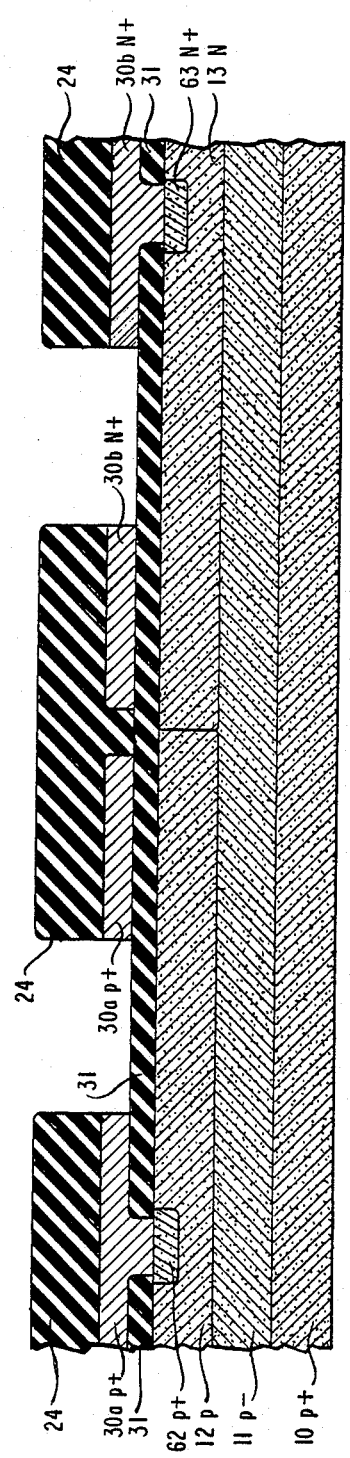

As illustrated in FIG. 20, the field oxide, 24, and polycrystalline portions 30a and 30b can be etched, as previously described, in order to define the active regions of the devices.

Figure 21:
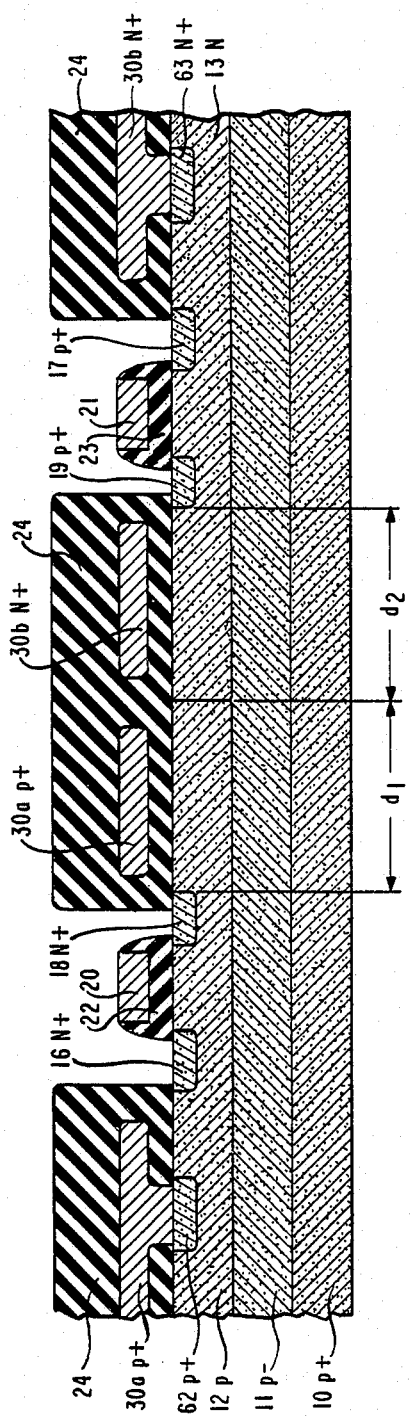

A CVD oxide can then be deposited, as before, in order to provide some insulation between the shield layer and the gate metal of the devices. The portions of layer 31 in the active regions are then etched to expose the semiconductor surface. This is followed by normal FET fabrication to form the gate oxides 22 and 23, gate electrodes, 20 and 21, source regions, 16 and 17, and drain regions, 18 and 19, as illustrated in FIG. 21. Standard contacts (not shown) to the source and drain regions and the gate electrode can then be provided.

It will be noted in this embodiment that providing p+ portions 30a and n+ portions 30b of the field shield layer over tubs of the same conductivity type (p-tub 12 and n-tub 13, respectively) results in increased protection against inversion of the semiconductor surface between the drain regions (18 and 19) and their adjacent tub regions (13 and 12), independent of any radiation exposure. This feature can be utilized to provide narrower spacings between n+/p (and p+/n) junction edges and the tub boundaries. For example, in a typical CMOS device of the type shown in FIG. 21, the distance from the closest edge of the n+ and p+ drains (18 and 19) to their respective tub boundaries ($d_1$ and $d_2$) is usually 2-2.5 μm. However, utilizing the shield layer portions 30a and 30b can reduce those distances to approximately 1-1.5 μm.

Figure 22:
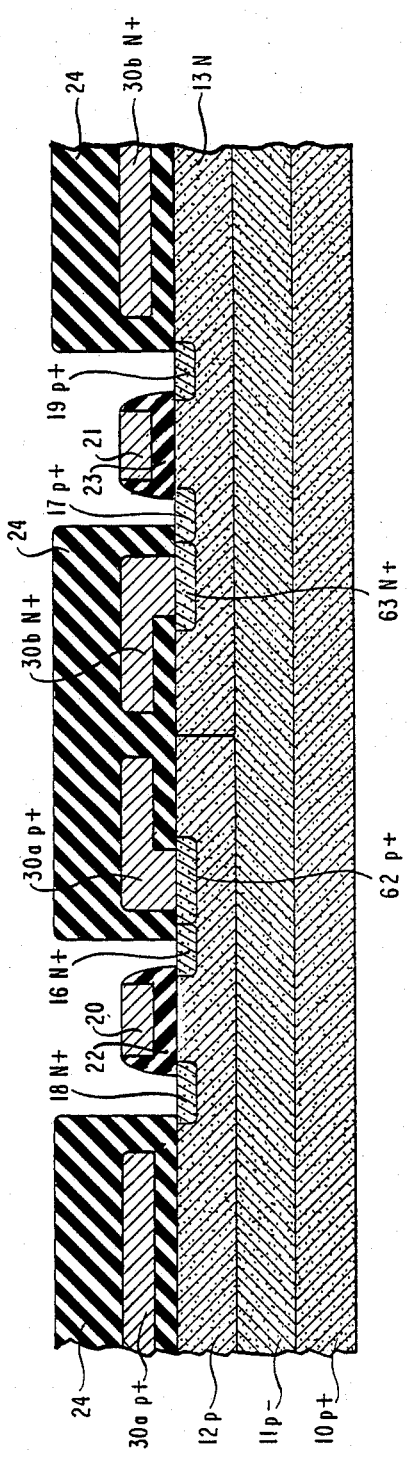
FIG. 22 is a cross-sectional view of a device at one stage of fabrication in accordance with a still further embodiment.

It will be appreciated that, while this embodiment has illustrated FET devices with their drain regions nearest the tub boundaries, devices with their source regions nearest the boundaries can be fabricated as illustrated in FIG. 22, where elements corresponding to those of FIGS. 15-21 are similarly numbered. Further, as also illustrated in FIG. 22, the contacts, 62 and 63, from the shield layers, 30a and 30b, can be provided so that they abut the source regions, 16 and 17, of the FETs.

While the invention has been described with reference to an MOS circuit, the principles could also be applied to bipolar devices and circuits. In such cases the active portions can be considered any area of the semiconductor not covered by a thick oxide.

Various additional modifications of the invention as described herein will become apparent to those skilled in the art. All such variations which basically rely on the teachings through which the invention has advanced the art are properly considered within the scope of the invention.

What is claimed is:

1. A semiconductor device comprising:
   a semiconductor substrate including active and inactive portions with a thick insulator overlying the inactive portion;
   a conductive layer placed between the inactive portion of the semiconductor substrate and the thick insulator over essentially the entire area of the inactive portion, said conductive layer being electrically coupled to the underlying semiconductor substrate;
   a first thin insulating layer covering the edges of the conductive layer in order to electrically isolate the conductive layer from other conductors extending over the active and inactive portions, said insulating layer having a thickness which is substantially less than the thick insulator; and
   a second thin insulating layer between the conductive layer and the semiconductor substrate, said layer having a thickness in the range 50-1,000 angstroms;
   the conductive layer being aligned with the active portion of the substrate as a result of the elements of the active portion being formed after said conductive layer.

2. The device according to claim 1 wherein the semiconductor substrate includes n-type and p-type surface regions and the portions of the conductive layer overlying different surfaces are electrically isolated from one another.

3. The device according to claim 3 wherein a trench is formed into the semiconductor substrate to isolate the n-type and p-type surface regions and the conductive layer is etched away in the areas over the trenches.

4. The device according to claim 1 wherein the conductive layer comprises polycrystalline silicon.

5. The device according to claim 1 wherein the thickness of the conductive layer lies within the range 250-5,000 Angstroms.

6. The device according to claim 1 wherein the device includes a third thin insulating layer overlying the active portions and the thick insulating layer is at least ten times the thickness of the thin insulating layer.

7. The device according to claim 6 wherein the transition regions between the thicker and the third thin insulating layers is sloped.

8. The device according to claim 1 wherein the insulating layers comprises $SiO_2$.

9. The device according to claim 1 wherein the active portion includes a source region, a drain region, a channel therebetween and a gate electrode overlying the channel region and extending over the thick insulator, the conductive layer being laterally spaced from the edge of said gate electrode over the active region by the thin insulating layer.

10. A semiconductor device comprising:
a substrate which includes at least one active region containing a transistor and at least one inactive region with a first insulating layer over the inactive region,
characterized in that said device further comprises:
a conductive layer over essentially the entire area of the inactive region, said conductive layer being electrically coupled to the substrate and positioned so as to inhibit the inversion of said inactive region;
a second insulating layer covering the edges of the conductive layer in order to electrically isolate the conductive layer from other conductors extending over the active and inactive regions, said insulating layer having a thickness which is substantially less than the thickness of the first insulating layer; and
a third insulating layer between the conductive layer and the semiconductor substrate, said layer having a thickness in the range 50–1,000 angstroms;
the conductive layer being aligned with the active region as a result of the elements of the transistor being formed after said conductive layer.

11. A semiconductor device comprising:
a semiconductor substrate including active and inactive portions with a thick insulator overlying the inactive portion, the substrate further including n-type and p-type surface regions in the inactive portion; and
a conductive layer comprising polycrystalline silicon placed between the inactive portion of the semiconductor substrate and the thick insulator over essentially the entire area of the inactive portion, the said conductive layer being electrically coupled to the underlying semiconductor substrate, the portion of said layer over the n-type region having an n-type conductivity and the portion over the p-type region having a p-type conductivity, and the portions of the said conductive layer overlying different surface regions being electrically isolated from one another.

12. The device according to claim 11 wherein each of said portions is coupled to the underlying surface through a localized region on the semiconductor substrate having the same conductivity type but higher impurity concentration than the surface region.

13. The device according to claim 12 further comprising a field effect transistor with a source region in each of the active regions and wherein the localized regions abut one of said source regions.

14. The device according to claim 11 further comprising a second thin insulating layer between the conductive layer and the semiconductor substrate, and where the conductive layer is coupled to the underlying surface regions through openings in said insulating layer.

15. The device according to claim 11 further comprising a field effect transistor with source and drain regions in each of the active regions and wherein the distance between a surface region boundary and an edge of the closest of said source and drain regions within said surface region to the boundary is less than 1.5 $\mu$m.

* * * * *